United States Patent
Hsu et al.

(10) Patent No.: US 7,269,240 B2
(45) Date of Patent: Sep. 11, 2007

(54) MULTI-PORT NETWORK INTERFACE CIRCUIT AND RELATED METHOD FOR TRIGGERING TRANSMISSION SIGNALS OF MULTIPLE PORTS WITH CLOCKS OF DIFFERENT PHASES

(75) Inventors: Ming-Hsun Hsu, Taipei Hsien (TW); Chien-Cheng Chang, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 752 days.

(21) Appl. No.: 10/249,496

(22) Filed: Apr. 15, 2003

(65) Prior Publication Data

US 2004/0109520 A1   Jun. 10, 2004

(30) Foreign Application Priority Data

Dec. 5, 2002   (TW) ............................... 91135336 A (51) Int. Cl.
*H03D 3/24*   (2006.01)
(52) U.S. Cl. .......................................... 375/376; 331/57
(58) Field of Classification Search ................ 375/376, 375/298, 295, 315; 331/57
See application file for complete search history.

(56) References Cited

U.S. PATENT DOCUMENTS

| | | | |
|---|---|---|---|
| 4,943,857 A * | 7/1990 | Izuno et al. ................. 348/537 |
| 5,231,650 A * | 7/1993 | Satomura ..................... 375/342 |
| 5,552,733 A * | 9/1996 | Lesmeister ................... 327/295 |
| 5,561,398 A * | 10/1996 | Rasmussen ................ 331/36 C |
| 5,774,701 A * | 6/1998 | Matsui et al. ................ 713/501 |
| 5,872,823 A | 2/1999 | Sutton |
| 6,496,555 B1 * | 12/2002 | Soda ........................... 375/376 |
| 6,677,825 B2 | 1/2004 | Kozaki |
| 6,732,205 B2 | 5/2004 | Kamihara et al. |
| 6,993,109 B2 * | 1/2006 | Lee et al. .................... 375/376 |
| 2002/0073351 A1* | 6/2002 | Oh ............................. 713/500 |
| 2002/0083360 A1* | 6/2002 | Popplewell et al. ........... 714/2 |
| 2003/0043935 A1* | 3/2003 | Noh ............................ 375/316 |
| 2004/0095116 A1* | 5/2004 | Kernahan et al. ........... 323/282 |
| 2006/0023827 A1* | 2/2006 | Sanders et al. ............. 375/376 |

FOREIGN PATENT DOCUMENTS

| | | |
|---|---|---|
| CN | 1220794 A | 6/1999 |
| CN | 1350234 A | 5/2002 |
| CN | 1387314 A | 12/2002 |

* cited by examiner

*Primary Examiner*—Temesghen Ghebretinsae
*Assistant Examiner*—Juan Alberto Torres
(74) *Attorney, Agent, or Firm*—Winston Hsu (57) ABSTRACT

A multi-port network interface circuit and relative control method. The multi-port network is used for transmitting a plurality of signals to different nodes (like terminals) of a network via multiple ports of the network interface circuit. The network interface circuit triggers the transmission of the signals of the different ports with clocks of different phases, such that transition of the transmitted signals of different ports will not occur at a same time.

3 Claims, 6 Drawing Sheets

MULTI-PORT NETWORK INTERFACE CIRCUIT AND RELATED METHOD FOR TRIGGERING TRANSMISSION SIGNALS OF MULTIPLE PORTS WITH CLOCKS OF DIFFERENT PHASES

BACKGROUND OF INVENTION

1. Field of the Invention

The present invention relates to a multiple-port network interface circuit and related controlling method, and more particularly, to a multiple-port network interface circuit capable of transmitting a plurality of signals to access points, like terminals, over a network via a plurality of embedded ports. The network interface circuit triggers signal transmissions on the embedded ports with a variety of clocks of different phases to guarantee that data transmissions for the signals on the ports will not proceed simultaneously for improving power bounce and cross-talk.

2. Description of the Prior Art

In the modern information age, the Internet, capable of exchanging information, data, and knowledge efficiently, is becoming a very popular tool to develop new technologies and to improve relations among people. That is why it has become a major concern for information industry as well as government to develop any facilities related to the Internet as fast and thoroughly as possible.

A variety of network connection topologies have been used to build a network formed with a plurality of terminals. Each of the terminals in these topologies can be deemed as a node of the network and connections between these nodes, directly and indirectly, make up the network. For example, 10 BASE T and 100 BASE T, two popular patterns of local area networks, both adopt a star-structured topology to build a network, each of the terminals connecting to the rest of the nodes or to another network device (hubs, switches, or routers) via a hub or a switch to form a network and to exchange data with network-related devices in the network. In other words, a network-related device, such as the hub, switch, and router, interconnects with the nodes (terminals) to form a network so that users of any terminal can access data of the rest of the terminals via the network.

These network-related devices used to interconnect the nodes in the network usually comprise network connection ports through which data can be exchanged among the nodes, each network connection port being connected to only one node. These network devices can, therefore, transmit data signals with a network interface circuit to each of the network nodes via a corresponding network connection port and receive data transmitted from the network nodes, thus realizing inter-network connection. Please refer to FIG. 1, which is a function block diagram of a multiple-port network interface circuit 10 according to the prior art. The network interface circuit 10 can be a network interface circuit installed in a network device such as a hub, a switch or a router. In this embodiment, the network interface circuit 10 is assumed to be an eight-ported network interface. The eight ports of the eight-ported network interface circuit 10 are respectively connected to eight network nodes 19A through 19H (such as terminals or other network devices, like a computer, a network printer, a hub, or a switch). The network interface circuit 10 can transmit data to and receive data from the eight nodes simultaneously. The network interface circuit 10 comprises a medium access control (MAC) circuit 12 and a physical layer (PHY) circuit 14 for respectively accessing a MAC layer and a PHY layer in an open system interconnection (OSI) structure. The PHY circuit 14 comprises eight signal circuits 16A through 16H, which respectively corresponds to the eight nodes 19A through 19H, and is respectively connected to eight signal ports Sp1 through Sp8 for managing data ready to be respectively transmitted to the nodes 19A through 19H and for respectively forming corresponding signals mp1 through mp8 and respectively transmitting these signals mp1 through mp8 to the nodes 19A through 19H via corresponding transmission ports 22A through 22H. The signals transmitted from the nodes from 19A through 19H to the network interface circuit 10 are then further transmitted to a receiving circuit 18 via corresponding receiving ports 24A through 24H and to the MAC circuit 12. In other words, the transmission port 22A and the receiving port 24A combine to form a network connection port capable of accessing data of the node 19A in a duplex manner. Similarly, the transmission port 22B and the receiving port 24B combine to form another network port of the network interface circuit 10 to access data of the node 19B, and so on.

Figure 1:
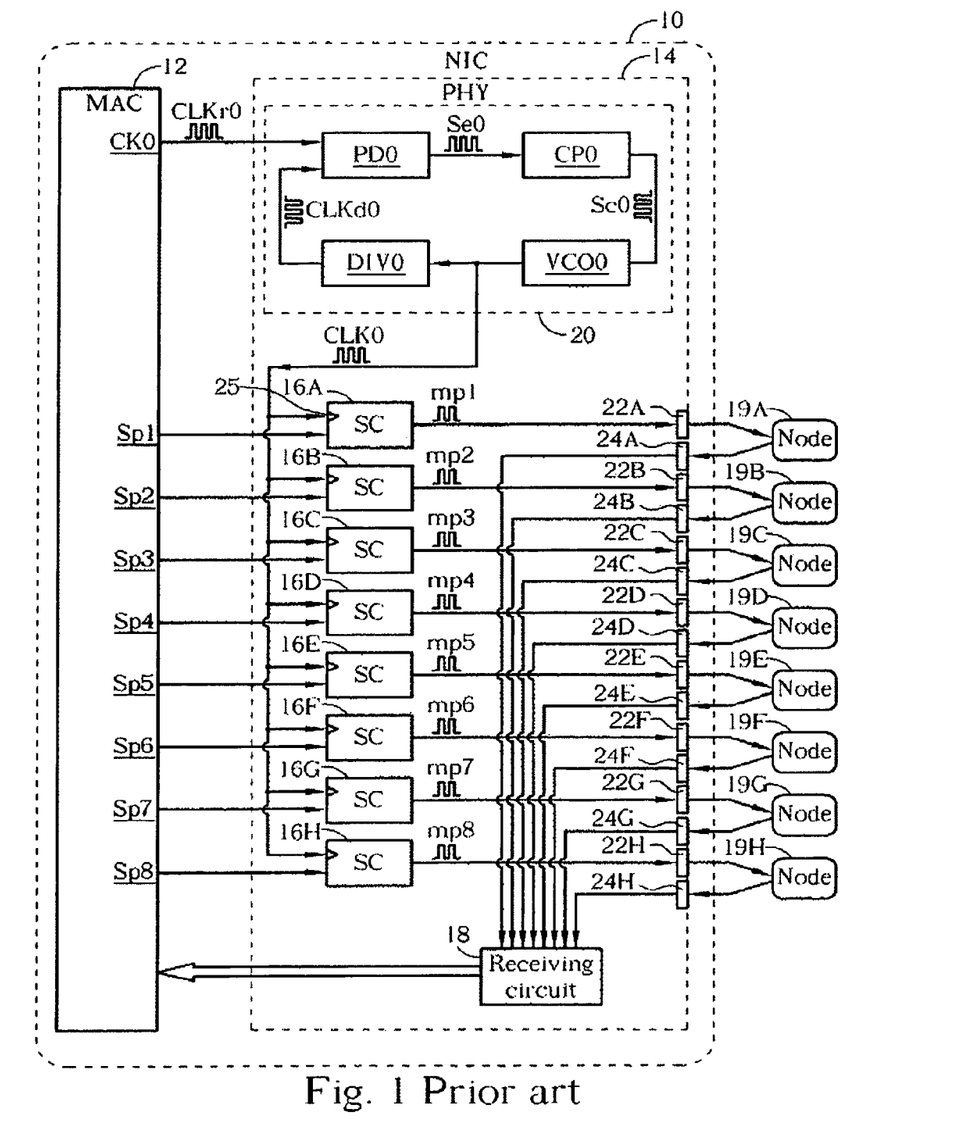
FIG. 1 is a function block diagram of a multiple-port network interface circuit according to the prior art.

In addition to the signal circuits 16A through 16H used to manage signal transmission and signal circuit 18 used for signal reception, the PHY circuit 14 further comprises a clock generator 20 for generating a clock CLK0 to coordinate operations of each of the function blocks in the PHY circuit 14, especially of the signal circuits 16A through 16H. Correspondingly, each of the signal circuits 16A through 16H also comprises a clock end 25 for receiving the clock CLK0 and operating accordingly. The clock generator 20 can be a phase-locked loop, which is electrically connected to the MAC circuit 12 for generating the clock CLK0 according to a reference clock CLKr0, which is generated by the MAC circuit 12. In other words, by controlling the reference clock CLKr0, the MAC circuit 12 is capable of controlling operation clocks of the PHY circuit 14, especially timing sequences of the nodes 19A through 19H. The clock generator 20, as a phase-locked loop, further comprises a phase detector PD0, a charge pump CP0, an oscillator VCO0, and/or a frequency divider DIV0. The phase detector PD0 detects frequency and phase differences between the reference clock CLKr0 and an oscillating clock CLKd0 and generates an error signal Se0. The charge pump CP0 transforms the error signal Se0 to a control signal Sc0 for controlling a voltage. For example, the charge pump CP0 can control currents flowing through a current source with the error signal Se0 and charges the currents into a capacitor to generate the control signal Sc0. The oscillator VCO0 generates the oscillating clock CLK0 and adjusts frequency of the oscillating clock CLK0 according to the control signal Sc0. The frequency divider DIV0 divides the clock CLK0 and generates an oscillating clock CLKd0, which is then fed back to the phase detector PD0 such that the clock generator 20 can adjust frequency of the clock CLK0 again according to the frequency and phase differences between the oscillating clock CLKd0 and reference clock CLKr0. Therefore, the clock CLK0 and the reference clock CLKr0 generated by the MAC circuit 12 is synchronized.

The operations of the MAC circuit 12 and the PHY circuit 14 are described as follows: The MAC circuit 12 packets data transmitted from the network interface circuit 10 to the nodes 19A through 19H and forms corresponding packets to be transmitted over a network. That is, for example, the MAC circuit 12 appends a header, an error check code, and an address, like a MAC address, of related physical apparatus to data. Packets ready to be transmitted to the nodes 19A through 19H are respectively transmitted to corresponding signal circuits 16A through 16H (the packet transmitted to the network node 19A is managed by the signal circuit 16A) and are managed by the corresponding signal circuits 16A through 16H with certain processes, such as scrambling, encoding and modulating, and signal driving. Then the processed packets can be transmitted from corresponding transmission ports to the nodes via transmission lines with stronger driving capability and better signal shape. Signals transmitted from the network nodes to the network interface circuit 10 are then received and decoded, descrambled or demodulated back to the original packets by the receiving circuit 18 and are transmitted back to the MAC circuit 12, which acquires data stored in these packets. Practically, the signals mp1 through mp8 transmitted to the nodes are transmitted to corresponding nodes in a differential form through transmission lines such as twisted-paired lines. Likewise, each of the network nodes transmits two signals opposite to each other to corresponding receiving ports 24A through 24H of the network interface circuit 10.

Figure 2:
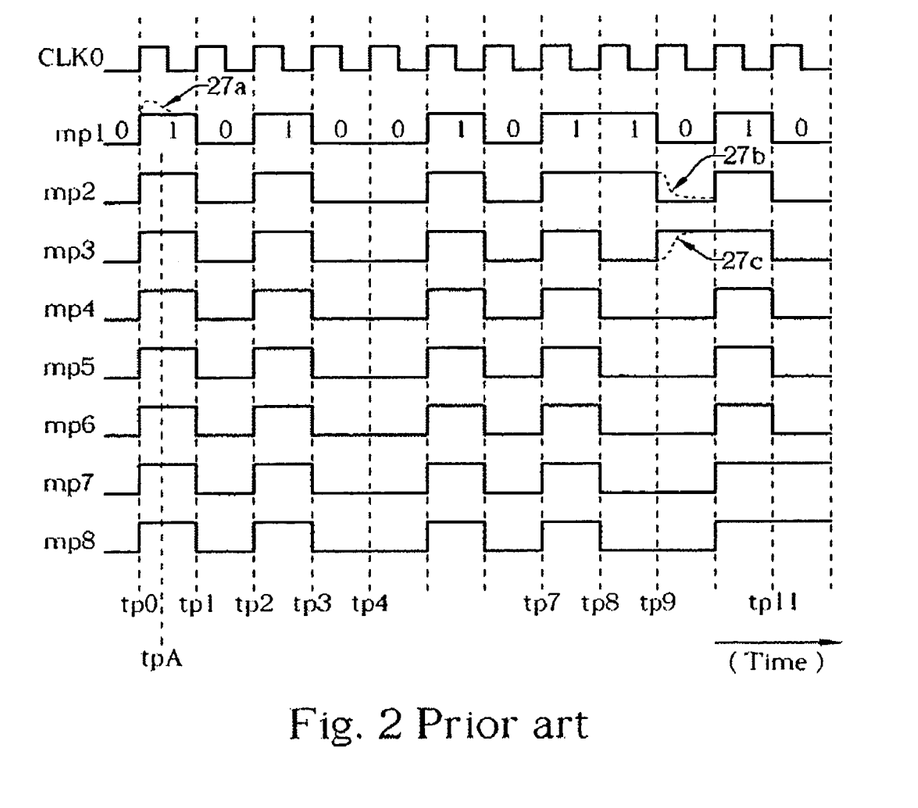
FIG. 2 is a timing diagram of a clock CLK0 and signals transmitted over transmission ports of the network interface circuit shown in FIG. 1 according to the prior art.

Please refer to FIG. 2 as well as to FIG. 1. FIG. 2 is a timing diagram of the clock CLK0 and signals mp1 through mp8 transmitted over the transmission ports 22A through 22H of the network interface circuit 10 according to the prior art, with a horizontal axis representing time and a vertical axis representing levels of the signals mp1 through mp8. In this embodiment, the signal circuits 16A through 16H are assumed to be rising-edge-triggered signal circuits. That is, as each of the signal circuits receives a triggering clock, the signal circuit manages corresponding signal processes and generates data at a moment corresponding to the rising edge of the triggering clock. As FIG. 1 shows, the signal circuits 16A through 16H are all triggered by the clock CLK0 simultaneously and the signals mp1 through mp8 may proceed with data transitions at the same time, changing from one data pattern to another. For example, as shown in FIG. 2, the clock CLK0 rises from a low level up to a high level at a time tp0 and generates a rising edge concurrently, and a data "0" transmitted with the signal mp1 is transformed into a data "1" at the time tp0. Likewise, the signal mp1 will be transformed from a first data "1" to a second data "0" at a time corresponding to another rising edge of the clock CLK0 at a time tp1. In the network interface circuit 10, because the signal circuits 16A through 16H are all triggered by an identical clock, clock CLK0, the signals mp1 through mp8 transmitted by the signal circuits proceed the data transition at the same time. As shown in FIG. 2, each of the signals mp1 through mp8 transform a data "0" to another data "1" at a time corresponding to a rising edge at time tp0, signals mp3 through mp8 transform a data "1" to another data "0" at a time corresponding to a rising edge at time tp8, and signals mp1 through mp6 transform a data "1" to another data "0" at a time corresponding to a rising edge at time tp11, and so on.

As known by those skilled in the art, the signal circuits 16A through 16H, if not having enough driving capability, cannot transmit the signals mp1 through mp8 respectively to the corresponding remote network nodes 19A through 19H. For example, a data transition of the signal circuit 16A at time tp0 for transmitting a data "0" and then a data "1" to the network node 19A can only happen at a moment when the signal circuit 16A has the capability to drive a transmission line connected between the transmission port 22A and the network node 19A with great enough current, and a voltage level of the transmission line transitions from a low voltage level of the data "0" to a high voltage level of the data "1". As soon as the voltage level of the transmission line is raised to the high voltage level, the burden on the signal circuit 16A to drive signals can be released and the transmission line can be kept at the high voltage level with only a small power. For example, no data transitions happen at time tpA and the PHY circuit 14 consumes little power, resulting in no power bounce. On the contrary, the signal circuit 16A cannot drop a voltage level of the transmission from a high voltage to a low one with too little current. Likewise, the remaining signal circuits 16B through 16H can only proceed with data transition with currents which are great enough to drive signals to corresponding remote nodes via the transmission line. However, since the prior art network interface circuit 10 triggers the signal circuits 16A through 16H with the identical clock CLK0 simultaneously, the signal circuits draw huge power to proceed with the data transition at the same time. Demanding power to drive signals by the signal circuits simultaneously abruptly arises power-consumption of the PHY circuit 14, thus generating the power bounce. In general, the network interface circuit 10 is provided by an external direct power source to function. If the power requested by the signal circuits 16A through 16H of the network interface circuit 10 to drive the data transition raises simultaneously, the external direct bias source can only provide unstable power to the network interface circuit 10 and generates ripples in frequency response to affect the signal circuits 16A through 16H. In particular, as the network interface circuit 10 begins to function, the network interface circuit 10 sends link pulses to each of the network nodes and establishes synchronous connections to the network nodes. During the establishment of the connections, because the signals m1 through m8 proceed the data transition simultaneously and request power to drive the data transition accordingly, as indicated by a period in FIG. 2 from time tp0 to time tp7, even though data the signals m1 through m8 transmit in a moment are varied, two signals or more are still likely to drive the data transition simultaneously, such as the signals mp3 through mp8 do at time tp8, and the power bounce inevitably occurs.

In addition to the power bounce, the simultaneously triggered data transition occurring in the prior art network interface circuit 10 also generates cross-talk among the signal circuits and transmission lines. For example, since the signals m1 through m8 are transited from low levels to high levels at time tp0 simultaneously, part of the energy of the signal mp2 will couple to the signal mp1 because of an additive electricity coupling between the signal circuits 16A and 16B, so a real level of the signal mp1 is higher than an ideal level of the signal mp1, as indicated by dashed waveform 27a shown in FIG. 2. In other words, after climbing to a predetermined voltage level, which indicates a digital "1", the signal mp1 continues climbing to a voltage level higher than the predetermined voltage level and probably damages the corresponding signal circuit. Likewise, the signal mp2 at time tp9 is transited from a high level to a low level and the signal mp3 from the low level to the high level. As the signal mp2 is pulled from the high level to the low level, part of the energy of the signal mp3 will couple the signal mp2 away from a voltage level substantially equal to zero volts (or take a long time to pull the signal mp2 down to zero voltages), as the dashed waveform 27b indicates. On the other hand, part of the energy of the signal mp2 will couple the signal mp3 to a voltage level lower than the high voltage level the ideal voltage level for the digital "1", as indicated by a dashed waveform 27c shown in FIG. 2. As soon as the aforementioned distortion or delay problems happen, data misunderstanding (misunderstanding a digital "1" as a digital "0") and the signals not being synchronous affect data transmission over a network.

In conclusion, the prior art network interface circuit 10 triggers signals ready to be transmitted to network nodes with an identical clock and gives the signals the data transition simultaneously, resulting in power bounce, cross-talk, the power provided by the network interface circuit 10 not being stable, and waveforms of the signals being distorted. In particular, it is becoming more and more critical to demand a high network data transmission rate in the modern information age, so the network interface circuit 10 needs more time to recover from an oscillating state to a stabilized one and aggravates the power bounce. Therefore, the signal circuits have to consume more power to drive the data transition, and the power bounce, electricity coupling, and waveform distortion due to the data transition become more and more apparent.

SUMMARY OF INVENTION

It is therefore a primary objective of the claimed invention to provide a network interface circuit and a related method to trigger signal circuits to transmit signals with a variety of clocks and vanish the possibility that the signals transmitted to network nodes drive data transition simultaneously and reduce the power bounce and cross-talk.

According to the prior art, the signal circuits for generating transmission signals are triggered by an identical clock, which drives the data transition of the signals simultaneously and thus induces the power bounce and cross-talk. Therefore, the prior art network interface circuit cannot function stably and suffers from distortion, delay, and misunderstanding of network data transmission waveforms.

In the claimed invention, signal circuits are triggered by a variety of clocks, whose phases are different from each other. Therefore, signals transmitted to network nodes by the network interface circuit will not drive data transition simultaneously. Therefore, power demand for the network interface circuit has no chances of being raised abruptly, preventing the power bounce from happening. Accordingly, the cross-talk of the data transition due to electricity coupling can be reduced as well.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3:
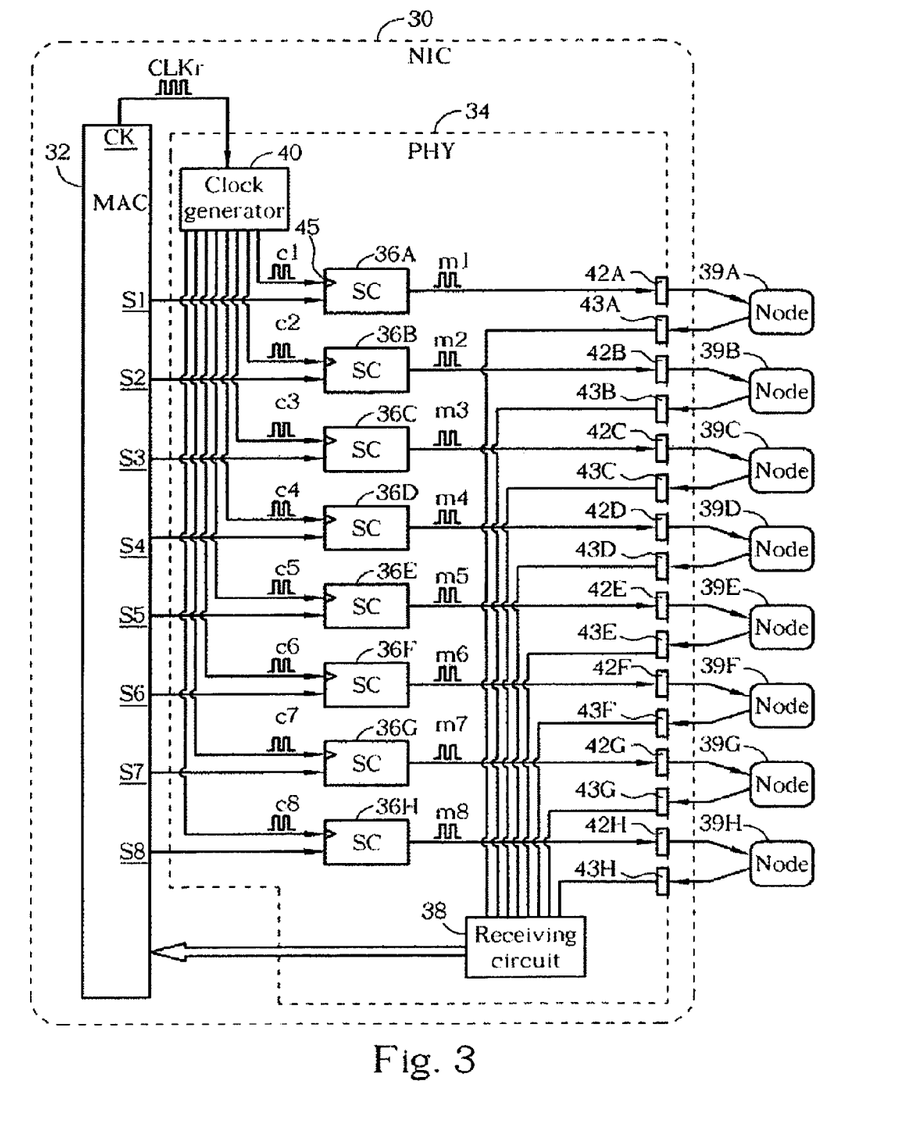
FIG. 3 is a function block diagram of a multiple-port network interface circuit according to the present invention.

Please refer to FIG. 3, which is a function block diagram of a multiple-port network interface circuit 30 according to the present invention. The network interface circuit 30 can be installed in a network device, such as a hub, a switch or a router, for exchanging data and information among network nodes. In the embodiment shown in FIG. 3, the network interface circuit 30 is assumed to be an eight-ported network interface circuit and capable of exchanging data and information among eight network nodes 39A through 39H with eight corresponding network connection ports. The network interface circuit 30 also comprises a PHY circuit 34 and a MAC circuit 32 for managing network transmission. The PHY circuit 34 comprises a clock generator 40, a receiving circuit 38, and eight signal circuits 36A through 36H for correspondingly generating eight signals m1 through m8 and for transmitting these eight signals to the corresponding network nodes 39A through 39H via eight transmission ports 42A through 42H respectively. Signals returned from the network nodes 39A through 39H to the network interface circuit 30 will be respectively received by corresponding receiving ports 43A through 43H and transmitted to the receiving circuit 38 and back to the MAC circuit 32. Each of the signal circuits 36A through 36H comprises a clock end 45 for receiving a clock to trigger the signal circuit. The signal circuits 39A through 39H are triggered by eight distinct clocks c1 through c8 instead of an identical clock. To conform with the above mechanism, the clock generator 40 generates the eight clocks c1 through c8 according to a reference clock CLKr, which is output by the MAC circuit 32 from the clock end 45.

How the network interface circuit 30 operates is described as follows: Similar to the operations of the network interface circuit 10 shown in FIG. 1, the MAC circuit 32 packets data ready to be transmitted to network nodes to be a packet and transmits the packet to the corresponding signal circuits 36A through 36H via corresponding network connection ports S1 through S8. The signal circuits 36A through 36H depend on control signals transmitted by the MAC circuit 32 and give the packet a variety of signal-processing steps, such as scrambling, encoding and modulating. Triggered by the corresponding clock c1 through c8, the signal circuits 36A through 36H then generate signals m1 through m8 respectively and transmit the signals m1 through m8 to the network nodes 39A through 39H via the corresponding transmission ports 42A through 42H. The signals transmitted from the network nodes 39A through 39H to the network interface circuit 30 are further transmitted to the receiving circuit 38 via the corresponding receiving ports 43A through 43H and given another variety of signal-processing steps, such as demodulating, decoding and de-scrambling, to return to the original packet and to be transmitted back to the MAC circuit 32. Then the MAC circuit 32 can unpack the packet to acquire the data contained in the packet. The transmission ports 42A through 42H combine with the receiving ports 43A through 43H to form network connection ports for accessing the network nodes 39A through 39H respectively.

Figure 4:
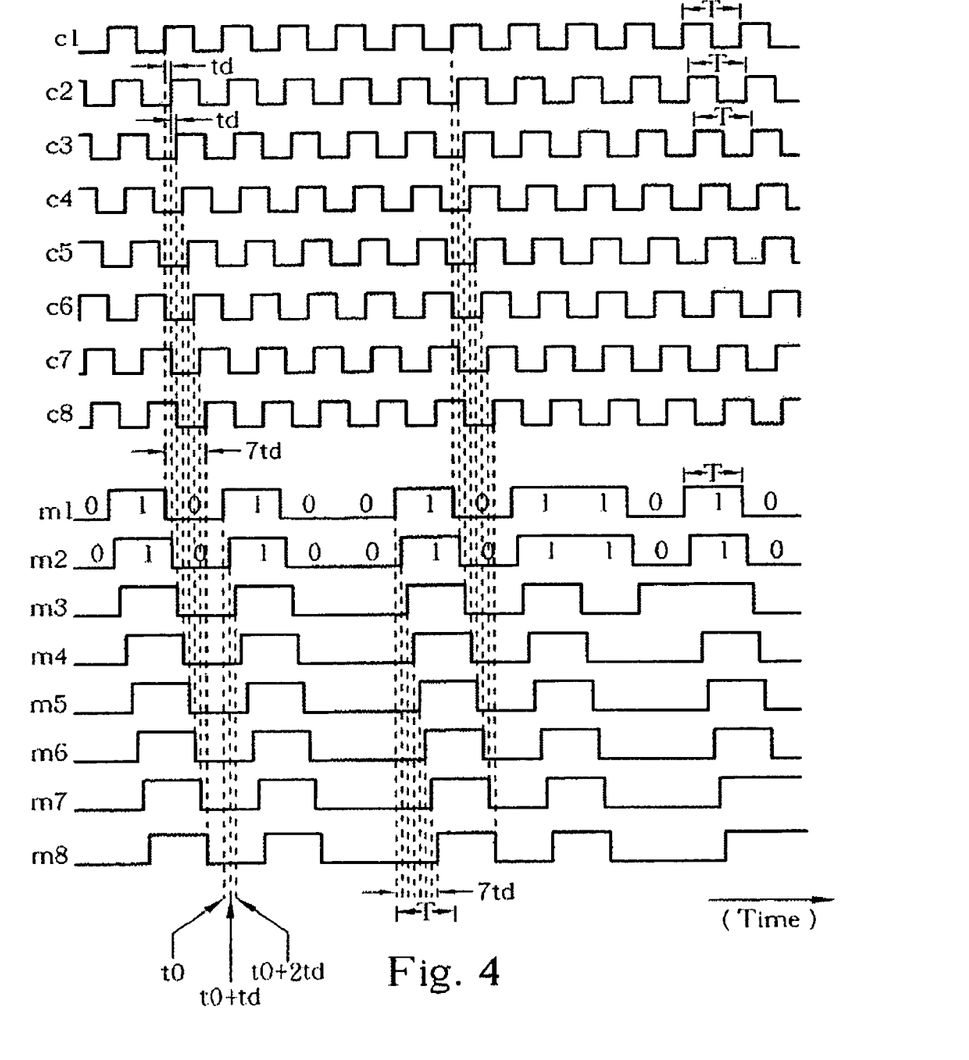
FIG. 4 is a timing diagram of the signals and corresponding clocks of the network interface circuit shown in FIG. 3 applied in an embodiment according to the present invention.

The signal circuits 36A through 36H are triggered by the corresponding clocks c1 through c8, whose phases are different from each other, and times when data transitions of signals m1 through m8 start are staggered. The operating mechanism described above is demonstrated in FIG. 4. Please refer to FIG. 4, as well as to FIG. 3. FIG. 4 is a timing diagram of the signals m1 through m8 and corresponding clocks c1 through c8 in an embodiment according to the present invention. In the embodiment shown in FIG. 4, the clock generator 40 generates the eight clocks c1 through c8, where different clock has the same frequency but different phase, to trigger the signals m1 through m8 by determining a reference clock CLKr. Therefore, the times when the data transition of signals m1 through m8 start differ. For example, as shown in FIG. 4, the clocks c1 and c2 have an identical period T but different phases. A phase difference between the clocks c1 and c2 corresponds to a time delay in a waveform. A time delay period td, as indicated in FIG. 4, exists at an interval from the rising edge of the clock c1 to the rising edge of c2. Accordingly, the times when data transition starts for the signals m1 and m2 respectively also differ by the period td. In FIG. 4, triggered by the clock c1 (rising-edged triggering), the signal m1 starts a data transition at time t0, transforming a data "0" into a data "1". The signal m2, triggered by the clock c2, however, does not have the data transition until at time t0+td, which is later than time t0 by the delay period td, a data "0" being transformed into a data "1" at time t0+td. That is, as the data "0" of the signal m1 all have been transformed into the data "1", the signal m2 is still transmitting the data "0", and no data transition happens for the signal m2. Likewise, the clocks c2 and c3 differ by a phase difference (corresponding to the time delay td) and the times when the data transition starts for the signals m2 and m3 differ by the time delay td. After the data transition starts at time t0+td for the signal m2, the signal m3 does not have any data transition until time t0+2td, then a data "0" being transformed into a data "1". Likewise, in the embodiment shown in FIG. 4, the clocks c1 through c8 differ from each other by the period and the times when the data transition for the signals m1 through m8 starts are different and disperse on a time domain, vanishing the possibility of having the data transition at the same time.

As long as the times the data transitions starts for the signals m1 through m8 are different, the times the signal circuits 36A through 36H raise power to drive the data transition are different accordingly, reducing the possibility of power bounce. As described previously, when data transition is given, power needed for a corresponding signal circuit to drive the data transition will be raised accordingly. According to the prior art, the data transitions start at the same time for the signals m1 through m8 and power demand for the signals circuits 36A through 36H raise simultaneously, resulting that the network interface circuit raises total power supply dramatically and that the power bounce, therefore, occurs. In contrast, the times the data transition starts for the signals m1 through m8 in the present invention are different and the times for the signal circuits 36A through 36H to raise driving power are thus different, so the total power consumed by the network interface circuit 30 disperse on the time domain, vanishing the power bounce. And because times the data transitions start for the signals m1 through m8 are different, cross-talk due to electricity coupling among the signals m1 through m8 can be avoided and waveforms in the present invention perform well, without getting any time delay. In particular, electromagnetic interference (EMI) in designing a chip can be improved dramatically. As the variation ratio of driving currents per second is reduced, the EMI in the chip drops. Practically, the phase difference (length of the period td) between any two clocks in the clocks c1 through c8 can be determined according to power response, cross-talk, and the period T. For example, if one signal circuit needs more power to respond to the data transition, and because the network interface circuit 30 is capable of resuming functioning moderately within a period ts, the power bounce is dramatically reduced as long as the period td is slightly larger than the period ts. Under the same scenario, the electricity coupling, as well as the cross-talk, at a time when one signal has given the data transition a transient state of the signal gives to the rest signals is dramatically reduced as long as the period td is slightly larger than the period ts2. By the way, phase differences between any two clocks in the clocks c1 through c8 are not necessarily equal. The difference between the clock c1 and c2, for example, differs from that between the clock c2 and c3.

Figure 5:
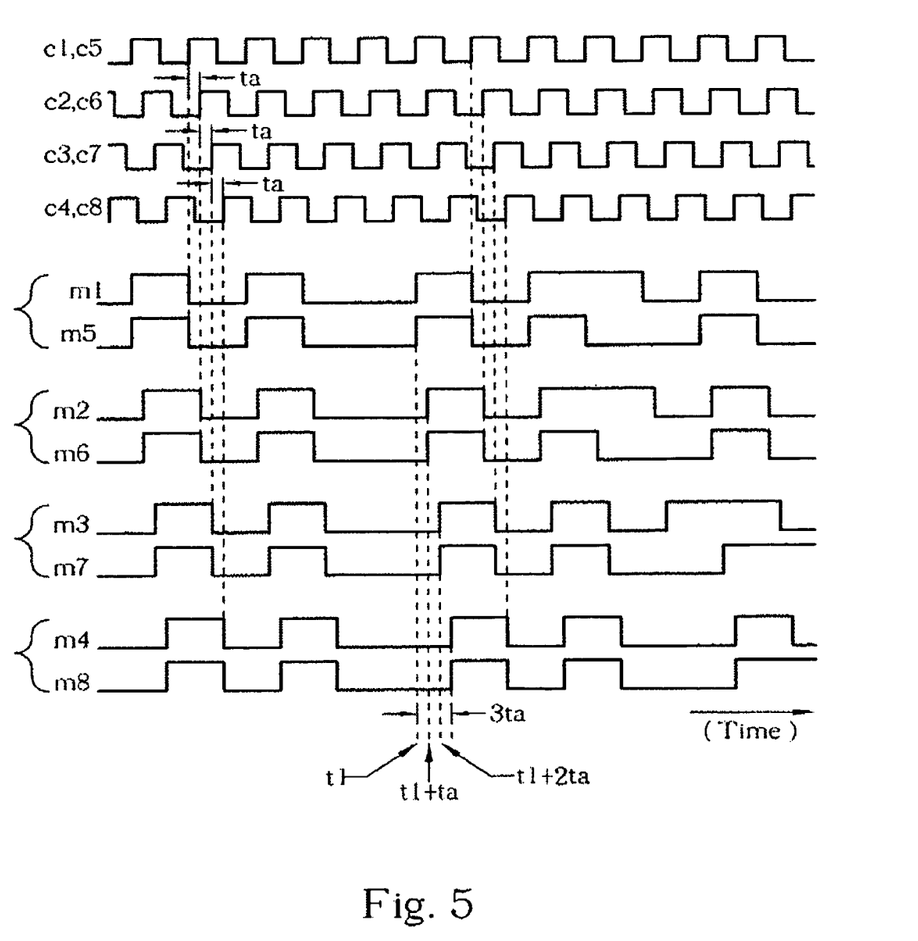
FIG. 5 is a timing diagram of the signals and clocks of the network interface circuit shown in FIG. 3 applied in a second embodiment according to the present invention.

Please refer to FIG. 5, as well as to FIG. 3. FIG. 5 is a timing diagram of the signals m1 through m8 and clocks c1 through c8 in a second embodiment according to the present invention, with a horizontal axis representing time and a vertical axis representing amplitudes of the signals m1 through m8 and clocks c1 through c8. In the second embodiment, the clock generator 40 generates four clocks, whose phases are different. The clocks c1 and a clock c5 in the four clocks have equal frequency and phase, as is the case with the clock c2 and a clock c6, the clock c3 and a clock c7, and the clock c4 and a clock c8. The phase differences among these clocks correspond to a delay time, the period ta. As shown in FIG. 5, rising edges of the clocks c1 and c5 differ from rising edges of the clocks c2 and c6 by a delay time the period ta, and rising edges of the clocks c3 and c7 differ from the rising edges of the clocks c2 and c6 by the period ta, and so on. Respectively triggered by these clocks, the signals m1 and m5 give the data transition simultaneously, so do the signals m2 and m6, but the signals m1 and m5, m2 and m6 do not give data transition simultaneously. For example, in FIG. 5, the signals m1 and m5 are triggered at time t1 by the clocks c1 and c2 respectively and are raised from a low level data "0" to a high level "1". The signals m2 and m6 are triggered at time t1+ta, later than time t1 by time ta, by clocks c2 and c6 respectively and are raised from data "0" to data "1". Under the same scenario, the signals m3 and m7 do not give any data transitions until time t1+2ta. If power-supplying capability the network interface circuit 30 has is good enough to manage power demand of a plurality of signal circuits at the same time, the network interface circuit 30 can be designed as a circuit as the embodiment shown in FIG. 5, that is the signal circuits being in groups of more than one signal circuit (the signal circuits shown in FIG. 5 are in groups of two) and the signal circuits in each group being respectively triggered by a corresponding number of clocks, whose phases are equal. According to this embodiment, the clock generator 40 can only generate few clocks to drive the whole system and has a variety of ways in distributing the clocks, that is, that of the period ta. Even so, the power bounce due to a power demand requested by more than one signal circuits simultaneously can be avoided. In conclusion, the present invention is capable of controlling the number of signal circuits which request more driving power and, therefore, is capable of managing power supply of the network interface circuit 30. As the embodiment shown in FIG. 5 demonstrates, since only two signal circuits in one group request more power supply to drive the data transition, two signal circuits at most, for example, at time t1 giving the signals m1 and m5 the data transition, a circuit designer while designing a circuit can preferably control power demand at any time for the network interface circuit 30. In contrast, because the prior art network interface circuit 10 may give all the eight signal circuits the data transition simultaneously at a time but only one at another time, the power demand of the prior art is uncertain, thus increasing the complexity of circuit designing. Furthermore, as far as the embodiment shown in FIG. 5 is concerned practically, two or more than two signal circuits far away from each other can be grouped and triggered by an identical clock. Since the cross-talk generated by signal circuits near to each other cause great damage, the electricity coupling as well as the cross-talk caused by signal circuits away from each other are neglected even if the data transitions of the signal circuits occur simultaneously.

Figure 6:
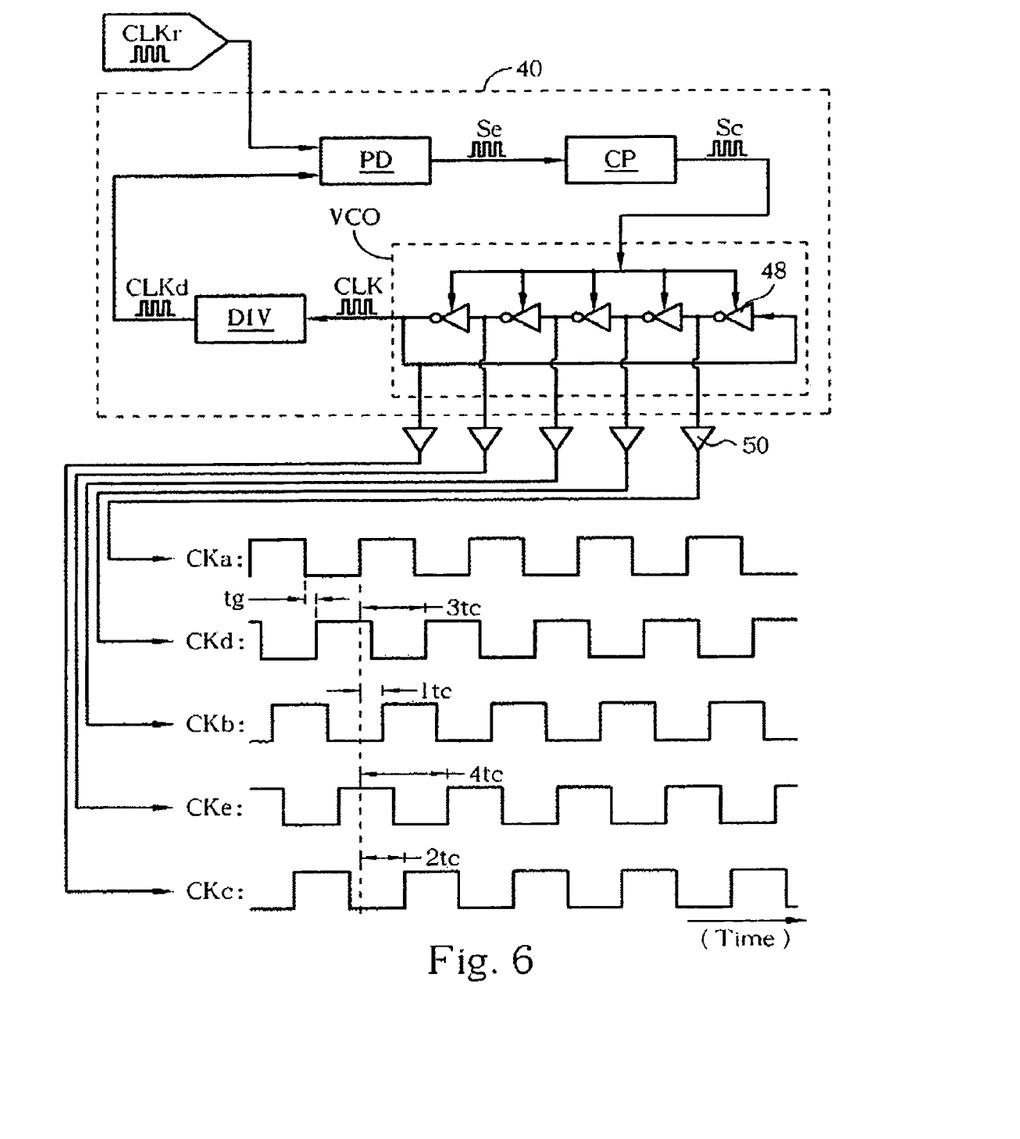
FIG. 6 is a function block diagram of an embodiment of the clock generator shown in FIG. 3 according to the present invention.

Please refer to FIG. 6, as well as to FIG. 3. FIG. 6 is a function block diagram of an embodiment of the clock generator 40 shown in FIG. 3 according to the present invention. According to the embodiment, the clock generator 40 comprises a phase detector PD, a charge pump CP, an oscillator VCO for forming a phase-locked loop, and/or a frequency divider DIV. Analogous to the clock generator 20 shown in FIG. 1, the clock generator 40 generates the clocks c1 through c8 by determining the reference clock CLKr generated by the MAC circuit 32 and triggers the signal circuits 36A through 36H with the clocks c1 through c8 to generate signals m1 through m8. Operations of the clock generator 40 are described as follows: The phase detector PD detects a frequency error or a phase error between a clock CLKd and the reference clock CLKr and generates an error signal Se. The charge pump CP depends on the error signal and generates a corresponding voltage control signal Sc. The oscillator VCO is capable of generating an oscillating clock and adjusts the frequency of the clock CLK according to the control signal Sc. The frequency divider DIV divides the clock CLK and generates a clock CLKd and feeds the clock CLKd back to the phase detector PD. The clock CLK will be further adjusted according to the frequency error and phase frequency between the clock CLKd and the reference clock CLKr until the clock CLK synchronizes with the reference clock CLKr. The oscillator VCO of the clock generator 40 can be realized by a ring-disposed oscillator shown in FIG. 6. The ring-disposed oscillator is made up by five serially connected inverters, the control signal Sc capable of controlling delay time for data output by the inverters and controlling the period of the clock CLK generated by the ring-disposed oscillator. Clocks generated by the inverters 48, whose phases are different, can be utilized in the present invention. Waveforms of clocks Cka through Cke depicted in FIG. 6 correspond to waveforms of signals output from the inverters of the oscillator VCO. According to FIG. 6, it is apparent that rising edges of the clocks CKb through Cke respectively fall behind that of the clock Cka by periods tc, 2tc, 3tc and 4tc. A period tg, which is shown in FIG. 6, is the delay time output from an inverter in an inverting manner. For example, the clock Cka passes through the inverter 48 and becomes the clock CKd. In utilizing the disposition in FIG. 6 to realize the present invention, the clocks Cka through CKd can be served as the clocks c1 through c4 (as well as the clocks c5 through c8) to realize the embodiment shown in FIG. 5. Furthermore, nine serially connected inverters to generate eight clocks whose phases are different can be realized the embodiment in FIG. 4. A buffer 50 can be used to raise the driving capabilities of the clocks at a time when the clocks are fetched from the inverters, thus preventing noises from entering into the phase-locked loop where the inverters are disposed in.

In conclusion, the signal circuits in the prior art network interface circuit to transmit signals are triggered by an identical clock and raise the power demand to give data transitions to the signals, thus creating transient power demands that rise abruptly and generate power bounces. Furthermore, as the signal circuits give data transitions simultaneously, waveform distortion and delays occur due to electricity coupling affecting signal transmissions over networks. In contrast to the prior art, the present invention can provide a network interface circuit, whose signal circuits are triggered by a variety of clocks whose phases are unequal, to guarantee that the power demand will not raise abruptly to vanish power bounce and cross-talk, and maintains quality of data transmitted over networks. In the 100 BASE T LAN specification, signals transmitted to network nodes are encoded in a code of MLT-3 to form signals whose data patterns are "−1", "0" and "1". The present invention can realize any multiple-port network devices under the 100 BASE T LAN specification to vanish power bounce and cross-talk in circuits of the network devices.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A network interface circuit for communicating with a plurality of access points, the network interface circuit comprising:
   a first signal circuit for generating a first signal according to a first clock;
   a second signal circuit for generating a second signal according to a second clock;
   a first transmission port and a second transmission port for respectively transmitting the first and second signals to the plurality of access points; and
   a clock generator for generating the first and second clocks, a predetermined phase difference existing between the first clock and the second clock and the first clock and the second clock having the same frequency, wherein the clock generator comprises:
      a phase detector for detecting a frequency error or a phase error between a reference clock and an oscillating clock and generating a corresponding error signal;
      a charge pump electrically connected to the phase detector for generating a control signal according to the error signal; and
      a ring-disposed oscillator electrically connected to the charge pump for adjusting the frequency of the oscillating clock according to the control signal, the ring-disposed oscillator comprising a plurality of inverters, each inverter capable of inverting signals output from another inverter and delaying the signals by a time period to generate corresponding output signals, the ring-disposed oscillator capable of adjusting delaying time periods of the inverters and selecting an output signal output from one of the inverters as the oscillating clock, the plurality of inverters comprising a first inverter delaying signals by a first time period and a second inverter delaying signals by a second time period different from the first time period, wherein the first clock and the second clocks are selected as outputs of different inverters in the ring-disposed oscillator.

2. A network interface circuit for communicating with a plurality of access points, the network interface circuit comprising:
   a phase-Locked loop for receiving an external reference clock and generating a plurality of clocks in accordance with the external reference clock, a predetermined phase difference existing between any two of the plurality of clocks and the plurality of clocks having the same frequency, wherein the phase-locked loop comprises:

a phase detector for detecting a frequency error or a phase error between the external reference signal and an oscillating clock and generating a corresponding error signal;

a charge pump electrically connected to the phase detector for generating a control signal according to the error signal; and a ring-disposed oscillator electrically connected to the charge pump for adjusting the frequency of the oscillating clock according to the control signal, the ring-disposed oscillator comprising a plurality of serially connected inverters, each inverter capable of inverting signals output from another inverter and delaying the signals by a time period to generate corresponding output signals, and the ring-disposed oscillator capable of adjusting delaying time periods of the inverters and selecting an output signal output from one of the inverters as the oscillating clock, the plurality of inverters comprising a first inverter delaying signals by a first time period and a second inverter delaying signals by a second time period different from the first time period, wherein the plurality of clocks are selected as outputs of different inverters in the ring-disposed oscillator;

a plurality of signal circuits coupled to the phase-locked loop for generating a plurality of transmission signals according to the plurality of clocks; and a plurality of network connection ports coupled to the plurality of signal circuits for respectively transmitting the plurality of transmission signals to the plurality of access points.

3. The network interface circuit of claim 2, wherein the control signal provides each of the inverters with a substantially equal delaying time period.

* * * * *